United States Patent [19]
Bischoff et al.

[11] Patent Number: 5,114,018
[45] Date of Patent: May 19, 1992

[54] VERSATILE PRODUCT CARRIER

[75] Inventors: Ronald E. Bischoff, Wappingers Falls; Mark A. Brandon, Poughkeepsie; John J. Caulfield, Fishkill; Lawrence G. Cook, Poughkeepsie; George B. Uplinger, Windsor, all of N.Y.

[73] Assignee: International Business Machines Corporation, Armonk, N.Y.

[21] Appl. No.: 737,968

[22] Filed: Jul. 30, 1991

Related U.S. Application Data

[63] Continuation of Ser. No. 410,377, Jul. 20, 1989, Pat. No. 5,042,671.

[51] Int. Cl.⁵ .............................................. A47F 7/00
[52] U.S. Cl. .................................... 211/41; 211/189
[58] Field of Search ............... 211/41, 182, 45, 189, 211/40; 361/415

[56] References Cited

U.S. PATENT DOCUMENTS

| | | |
|---|---|---|
| 3,014,594 | 12/1961 | Keistner . |
| 3,334,274 | 8/1967 | Warman et al. . |
| 3,473,670 | 10/1969 | Elftmann . |
| 3,487,948 | 1/1970 | Haidegger . |
| 3,826,377 | 7/1974 | Bachmann . |
| 3,828,726 | 8/1974 | Dietze et al. . |
| 3,877,134 | 4/1975 | Shanahan . |
| 3,926,305 | 12/1975 | Wallestad . |
| 4,023,691 | 5/1977 | Perel . |
| 4,153,164 | 5/1979 | Hofmeister ............................ 211/41 |
| 4,318,749 | 3/1982 | Mayer . |
| 4,355,974 | 10/1982 | Lee . |
| 4,527,222 | 7/1985 | Swingley, Jr. . |
| 4,721,427 | 1/1988 | Sanders et al. . |

Primary Examiner—David M. Purol
Assistant Examiner—Sarah A. Lechok
Attorney, Agent, or Firm—Aziz M. Ahsan

[57] ABSTRACT

The present invention relates generally to a new carrier for holding and transporting semiconductor products, and more specifically, to a versatile product carrier for holding and transporting a plurality of products, such as, ceramic substrates, green sheets, wafers, glass and/or metal masks, rigid or floppy disks, to name a few. The modular or versatile product carrier usually has two symmetrical cross-bars and two symmetrical end plates. The two cross-bars securely link into the end plates thereby forming the versatile product carrier of this invention. A cover that can be used to cover the versatile product carrier is also disclosed.

38 Claims, 5 Drawing Sheets

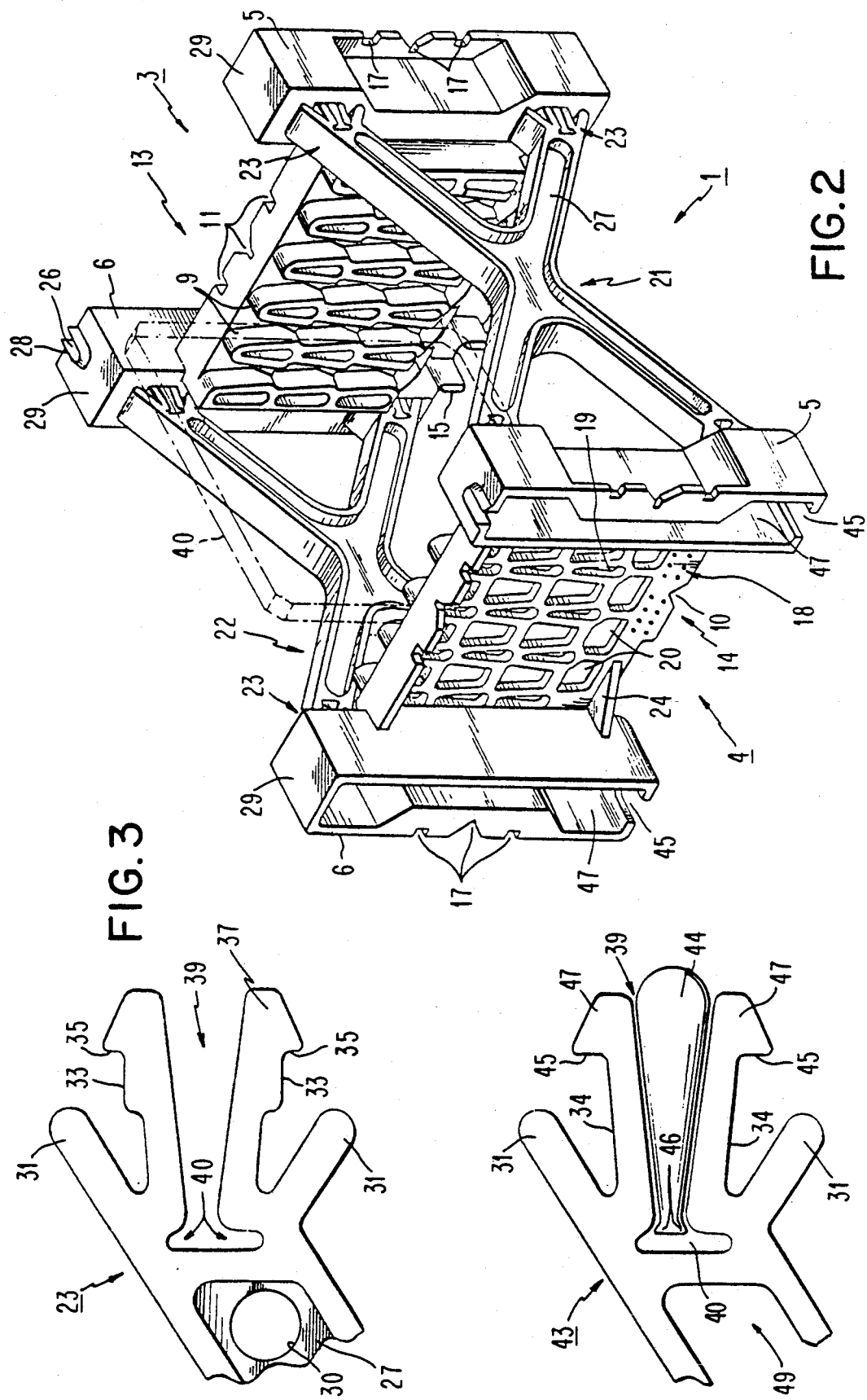

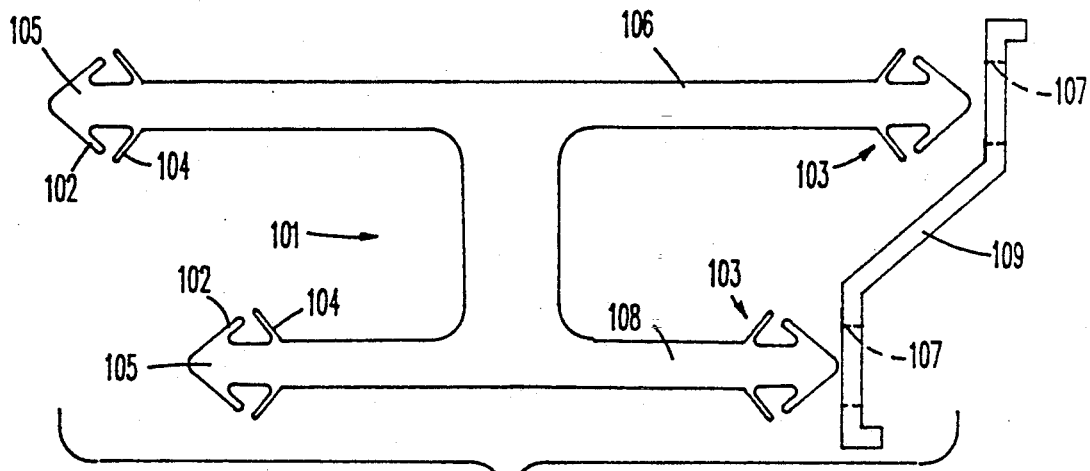
FIG. 7
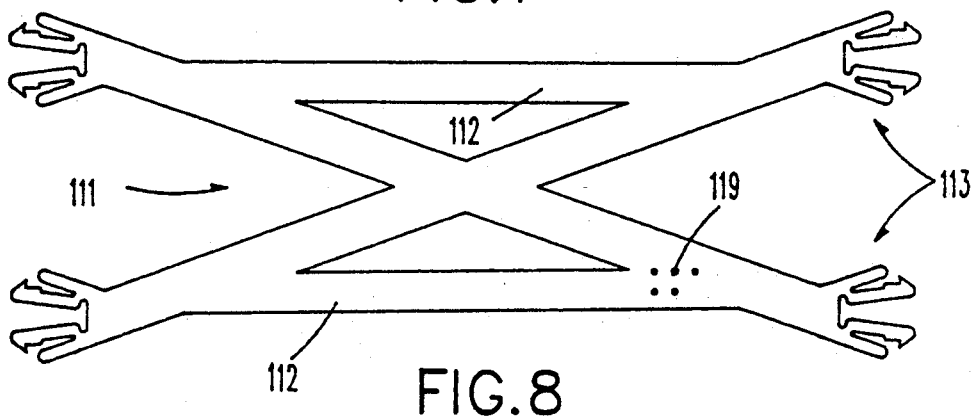
FIG. 8
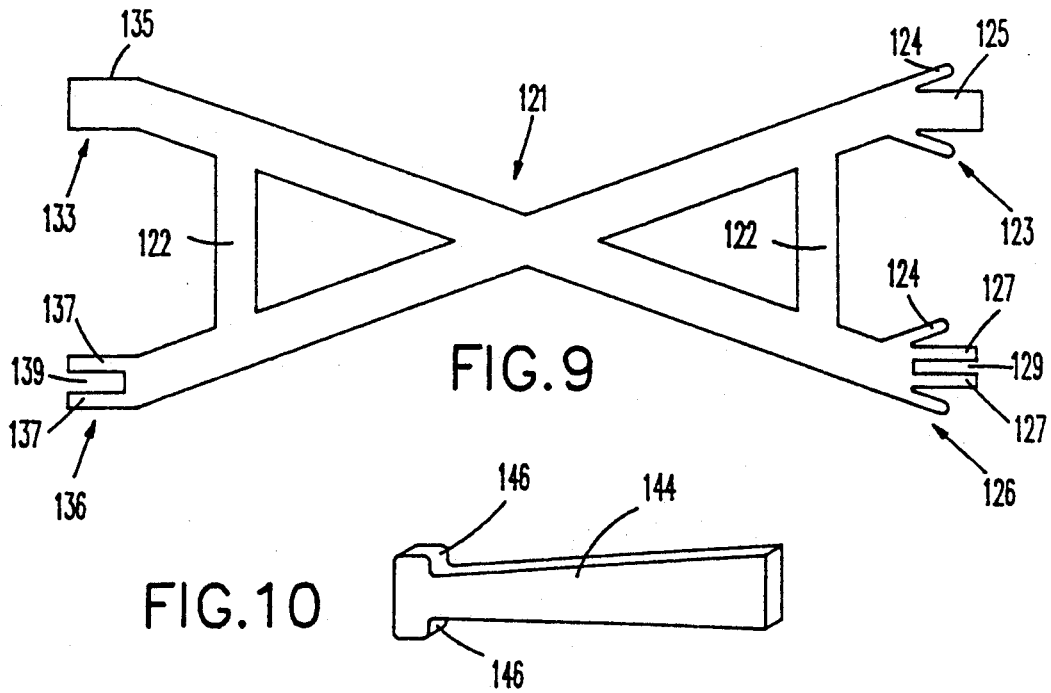
FIG. 9
FIG. 10

VERSATILE PRODUCT CARRIER

This is a continuation of Ser. No. 410,377, filed Sept. 20, 1989, now U.S. Pat. No. 5,042,671.

FIELD OF THE INVENTION

The present invention relates generally to a new carrier for holding and transporting semiconductor products, and more particularly, to a versatile product carrier for holding and transporting a plurality of products, such as, ceramic substrates. The modular or versatile product carrier has two symmetrical cross-bars and two symmetrical end plates. The two cross-bars securely link into the end plates thereby forming the versatile product carrier of this invention. A cover for the versatile product carrier of this invention is also disclosed.

BACKGROUND OF THE INVENTION

Carriers or boats for holding a plurality of spaced apart semiconductor products, such as wafers, green sheets, ceramic substrates, glass and/or metal masks, or rigid or floppy or optical disks, to name a few, are employed in many types of semiconductor processing systems to facilitate batch processing and to minimize damage of the products due to improper handling. Such carriers are employed, for example, as input magazines for sequentially supplying semiconductor products to automatic product handling and processing systems, or as output magazines for sequentially receiving processed semiconductor products from such systems, or as intermediate (throughput) devices for holding semiconductor products that may require sampling, testing, or some other special handling at some point during processing by such systems. In nearly all of these cases the product carriers must, at some point, be manually transported to or from such systems with the attendant risk that in so doing the semiconductor products may slip from the product carriers and thereby be damaged or broken, or that the product carrier may not be strong enough to hold all the products. This risk is particularly great in the case of carriers of the type permitting unobstructed passage of semiconductor products therethrough. If such carriers are tilted forward or backward while they are being manually transported, any semiconductor product contained therein may slide out. Although this risk is much less critical in the case of carriers of the type permitting passage of semiconductive wafers into or out of the carriers from only one end of the carrier, care must still be exercised while such a carrier is being manually transported to avoid tilting.

Another problem associated with a product carrier is deformation of the carrier. Past efforts to eliminate the risk of a carrier deforming during manually transporting semiconductor products have resulted in elaborate procedures. The risk was, in fact, not reduced at all because most all of these elaborate procedures address how the operator should transport these products in the carrier, without designing a carrier that would be versatile for all operations. Moreover, when placing the carrier in a wafer handling and processing system, the person transporting the carrier also had to remember to carefully release the semiconductor products into the handling and processing system. In addition to these drawbacks, such mechanisms are generally complex and add significantly to the cost of the carrier.

In an effort to reduce direct labor assembly costs, many manufacturers are presently employing robots for inserting the products into the appropriate location within electronic devices or testing or assembly devices. In order for a robot to successfully accomplish its task, the control system must be programmed to know both the precise location from which the product is to be picked up, i.e., the storage location, and the location at which the product is to be deposited. The versatile product carrier of this invention has means to indicate to the robot the precise location from where the product can be picked up or in which slot the product has to be placed.

Products are often transported in slotted plastic boxes in which they are held in edgewise fashion, and it is desirable to have the robot pick them up directly from the box. The plastic side-walls of conventional boxes are not always precise because of manufacturing tolerances, or the plastic side-walls may tend to become distorted after extended use. As a result, the location of the products within the box may not be precise or may tend to shift. The actual location of the product to be inserted into the box or taken out of the box by the robot may then differ from the location of the product known to the robot control system so that the robot may not properly grasp the desired product or may even grasp a different product from that which it has been commanded to grasp. This is a particular problem where a series of boxes must be handled and it is important to avoid inconsistencies from box to box.

In an effort to overcome these and other disadvantages associated with the storage and transportation of the products within a plastic box, the present invention is specifically directed to a structurally integrated product carrier which is directly engageable by a locating device, for precisely locating the products to facilitate automated handling.

More would be involved in highly automated systems. Obviously these product carriers require a considerable amount of handling.

The product carrier of the present invention greatly simplifies the handling of the empty carriers. In addition, the design of the product carrier permits the carriers to be stacked compactly and stored on site without substantially increasing the required floor space. The carrier can also be stored in an unassembled state to save valuable storage or site space. After processing, the empty product carriers are returned to the designated site so that additional product may be placed into the carrier.

These types of carriers or boats are used by the thousands in the semiconductor industry, and therefore, one of the major concerns for such product carriers or cassettes is their low cost along with other concerns.

The invention is a "Versatile Product Carrier", or VPC. Basically, the product carrier has two end plates and two cross-bars. The two end plates have to be symmetrical and the two cross-bars should be symmetrical with respect to each other. The exact shape of the two cross-bars will depend upon the product shape or geometry. The end plates have a centerpiece, and the centerpiece has columns at each end. These columns have openings on the side to accommodate the retaining end of the cross-bars. The centerpiece also has wave-like tracks for minimum point contact and to vertically hold the product. The minimum point contact further reduces particulate contamination normally produced by rubbing of the surfaces or by the adherence of the particulates to the surface within the track. The tracks in the centerpiece also keep the product from sliding or being damaged while it is being transported. Instead of the wave-like tracks in the centerpiece one could have slots that are presently used in the industry. The slots of course do not provide the minimum point contact. Stops in the centerpiece prevents the product from slipping or sliding through the product carriers.

The length of the cross-bars can vary depending on the size and/or shape of the product. Similarly, the size of the end plate and/or the opening or slots between the wave-like tracks or guides in the end piece can also vary depending upon the size of the product. These product carriers can be stacked one on top of each other and can be orientated as desired.

The material used to make the parts for the product carriers or cassettes should be of a strength to withstand some of the process that the product carrier either alone or with the substrates are normally exposed to, such as, spinning, developing, cleaning, baking, transferring, automatic inspection, and other loading and unloading operations.

The versatile product carrier of this invention is primarily made using extruded or molded plastic, but other types of material can be used, such as composites and metals. The preferable metals, for example, could be aluminum or stainless steel. Similarly, the product carrier can also be made from cast or machined plastic or metal or ceramic or any other material that would suit the process and/or product requirements. A portion or different parts or the whole versatile product carrier could also be coated with a coating of a suitable material. The suitable materials, for example, could be polytetrafluoroethylene or perfluoro alkoxy alkaline, to name a few. The overcoating or coating of the parts or the whole product carrier has many advantages, such as, to reduce or provide resistance from attack by chemicals and/or fluids. In situations where the part is made from a porous material, this overcoating would reduce or eliminate absorption of fluids and/or liquid by the porous part. Another advantage of having a coating would be to provide a cushion or abrasion-resistance to the product that may come in contact with the part. The propensity of the product carrier made of non-metallic material or having such an overcoating to damage the product contained therein is less than that of a product carrier made of aluminum or other metals. An antistatic coating could also be applied onto at least a part or a portion of the product carrier.

The material and design that is chosen to make the product carrier could also take into account the optimum chemical-mechanical-temperature compatibility for applications where the product carrier along with the product is going to be immersed into a liquid solution or a bath. Similarly, the criteria could also include whether or not the product carrier will be used in a clean room or a contamination-free environment.

The product carrier of this invention with minor changes can accept new products having different sizes. This means that all product carriers, both new and old, will be common to all existing process tools and handling techniques, e.g., robots, auto handling, monitors, readers, etc. All the product carriers will have the same form factor, e.g., foot print. Different products can be moved in and out of the production line with little or no changes. Similarly, the production line does not have to change.

SUMMARY OF THE INVENTION

A versatile product carrier comprising, a first end plate having a plurality of columns linked by a centerpiece, two or more linking means having a retaining means at each end, a second end plate having a plurality of columns linked by a centerpiece, each of the columns having at least one opening to accommodate the retaining means of the linking means, the first plate and the second plate are linked together by said retaining means by inserting the retaining means of the linking means into the openings in the columns.

A cover for a versatile product carrier comprising a first side-wall and a second side-wall, and a canopy links the first side-wall with the second side-wall.

BRIEF DESCRIPTION OF THE DRAWINGS

The features of the invention believed to be novel and the elements characteristic of the invention are set forth with particularity in the appended claims. The invention itself, however, both as to organization and method of operation, may best be understood by reference to the detailed description which follows taken in conjunction with the accompanying drawings in which:

FIG. 2 is a perspective view of the carrier of FIG. 1 showing the completely assembled versatile product carrier.

FIG. 3 is a side view of the head of a cross-bar made according to the preferred embodiment of the present invention.

FIG. 4 is a side view of another head of a cross-bar made according to the present invention.

FIG. 7 is a side view of another embodiment of the linking means along with a cut-away of an end column made according to the teaching of the present invention.

FIG. 8 is a side view of yet another embodiment of the linking means made according to the teaching of the present invention.

FIG. 9 is a side view of yet another embodiment of the linking means having a variety of retaining means made according to the disclosure of the present invention.

FIG. 10 is a perspective view of another embodiment of a wedge made according to the present invention.

DETAILED DESCRIPTION OF THE INVENTION

Figure 1:
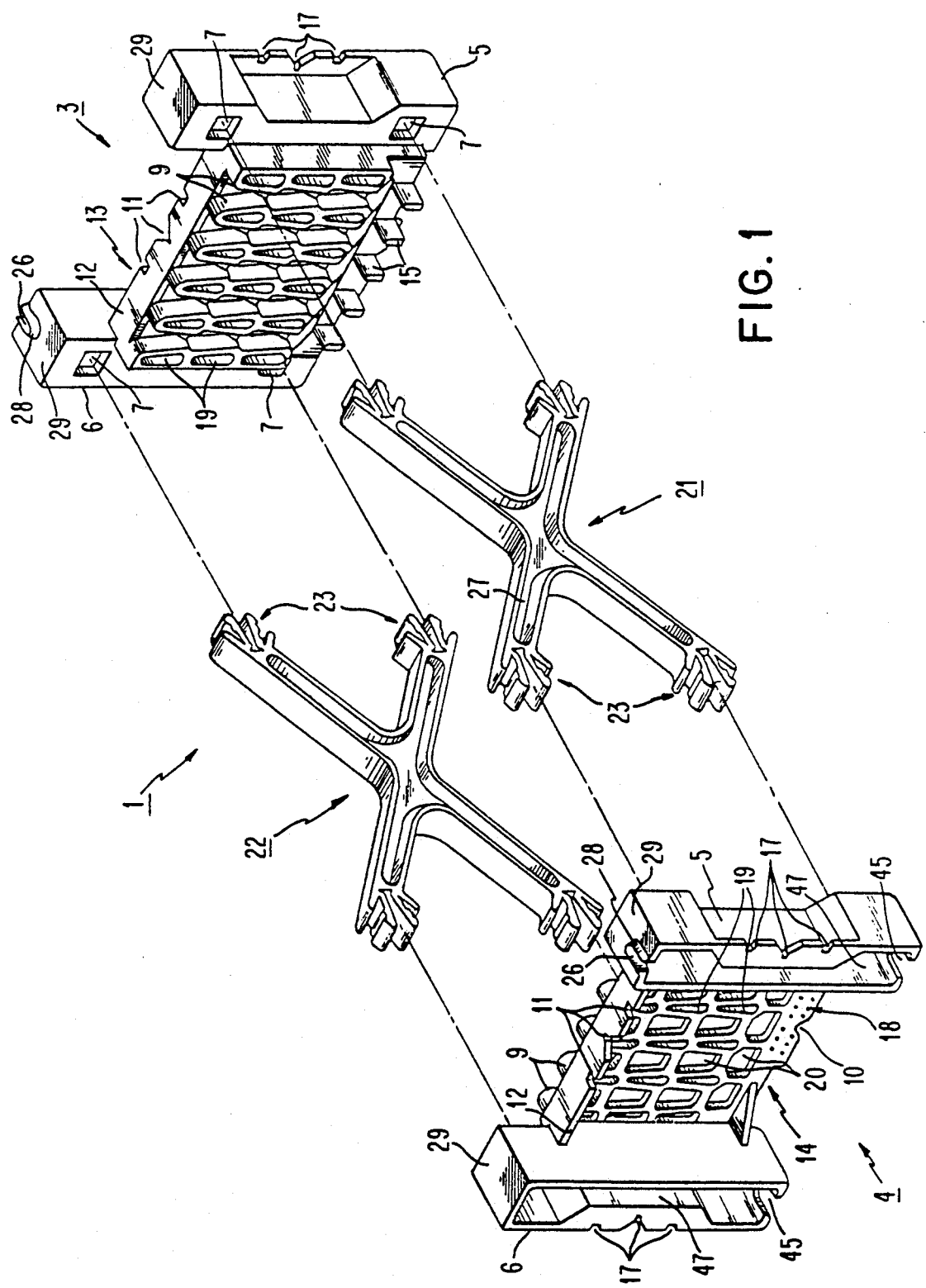
FIG. 1 is a perspective view of a versatile product carrier according to the preferred embodiment of the present invention.

The product carriers made according to the present invention are usually made of two common parts, i.e., the end plate and the cross-bar. These two parts are usually made using one mold or die. A new mold or die would only be required if different product thickness or length is required. The parts are welded, bonded or snapped together to make the carrier assembly. The parts can be interchanged to make the carrier dedicated to a particular product or substrate. Both the cross-bars and the end plates are usually symmetrical. As stated earlier the like parts should be interchangeable. This means that only one mold or die has to be made for each part. Therefore, the range of substrate or products that this invention can be used for is rather substantial.

The shape of the product that is placed inside the product carrier of this invention can be of any shape, such as a polygon, square, rectangular, circular, elliptical or rhombic, to name a few. Similarly, the length or the diameter of the different products can also vary.

To accommodate different sized products in one carrier, adapter plates or adapter rings can be used. The adapter ring personalizes the carrier for a particular substrate by making the adapter ring for that particular substrate's length, width or diameter. The adapter ring or plate would be the only non-standard part; however, it will slide into the same mounting slots as the other products. All parts in one product carrier are mounted in the same way regardless of their sizes or shapes.

The products or substrates are preferably held vertically in the product carrier, but, they could be mounted and held horizontally. The mounting method should be such as to allow air and cleaning fluids free and easy access without obstruction. This will improve cleaning of the substrate and reduces contamination. The adapter plate or ring holding the product or substrate makes minimal sliding contact with the raised segments or tracks as seen in the figures. The wave-like tracks also further reduce the surface-to-product contact contamination and the wave-like tracks also allow the cleaning fluids to easily and freely pass through. The whole product carrier has been designed to provide maximum product exposure for air purging and cleaning with no fluid traps.

The carrier parts are all interchangeable and therefore they can be mixed and matched, and can handle all types of handling techniques, such as manual or robotics.

The invention can provide structures of various sizes and shapes, which can be assembled and disassembled quickly and without assistance of special tools. The invention is very modular and can be adapted to a variety of product and/or processes.

The end plates are usually symmetrical and interchangeable. The end plates can have openings as shown, so that the end plates can be easily cleaned or the product that is contained inside this Versatile Product Carrier can be easily cleaned. Additionally, for some processes these openings or holes would be designed to allow for maximum product exposure to gas and/or liquid, as required by the product and/or process. The openings, of course, can be of any size or shape as long as they do not have an adverse affect on the integrity of the structure.

The invention allows the development of new products because the versatile product carrier of this invention is so modular that it does not require new facilities, new process tools or major changes to existing tools and facilities causing large capital expenditures and lost time. The existing parts or pieces from the product carrier can be easily changed, and only a limited number of new parts are needed for new products that need to be manufactured. The delays caused by custom designing product carriers for each new product or for each new application, usually, impedes new product development.

The carrier parts can be reclaimed and the carrier can be repaired by replacing damaged parts. There is, of course, substantial cost saving, because only the damaged part needs to be repaired or replaced, and the whole carrier does not have to be thrown away.

FIGS. 1 and 2 are the perspective views of the preferred embodiment of the versatile product carrier. The versatile product carrier 1, has four basic parts. They are the first end plate 3, second end plate 4, the first cross-bar 21, and the second cross-bar 22. Both end plates are symmetrical and are a mirror image of each other. Similarly, the two cross-bars or the linking means are symmetrical and are a mirror image of each other. The end plate 3, is comprised of three parts, namely, the centerpiece 13, and the two columns and 6. Similarly, the end plate 4, is comprised of three parts, namely, the centerpiece 14, and the two columns 5 and 6. Both columns 5 and 6, have openings 7, to accommodate the retaining means or the head 23, from the linking means or the cross-bars 21 and 22. Both columns 5 and 6 are identical in their shapes and sizes to each other, as shown in FIG. 1, but they do not have to be identical for some other application. The columns 5 and 6 are shown as being an integral part of the end plate 3 and 4, but the columns 5 and 6 can be formed separately and then secured to the end plate 3 and 4 by methods well known in the art. The end columns 5 and 6, also have alignment notch or notched openings 17, to align and/or guide the robotic arm during an automatic or robotic pick-up. Similarly, the centerpieces 13 and 14, have a ledge or lip 12, with lower notched- openings 10, and upper notched-openings 11, for aligning and/or guiding the robotic arm during automatic or robotic pick-up. The upper notched- openings 11, is similar to the notched-openings 17. Both end plates 3 and 4, have raised segments 9. The raised segments 9, could have an opening 19, to allow for fluids to pass through and for cleaning the versatile product carrier 1, and/or the product 40. Similarly, in areas not covered by the raised segment 9, it could have openings 20, to allow for fluids to pass through and for cleaning the versatile product carrier 1, and/or the product 40. The centerpieces 13 and 14, have a plurality of stops 15, between the raised segments 9, to prevent the product 40, from slipping or sliding. The top surface of the column 5, can be provided with a flat surface 29, for the mounting or forming of an identifying code, such as, a decal or the Universal Product Code (UPC) bar code or the surface could be provided with a Binary Code Decimal (BCD) code, to name a few. Having an identifying code on each carrier would be very helpful in tracking each of the carriers using optical or other electronic devices already known to the people skilled in the art. The top surface of columns 5 or 6, would have a protrusion 28, that would be used for the alignment of the carrier or for stacking of the carriers. The location of the flat surface 29 or the protrusion 28, should be in the top surface of one of the columns but it does not have to be there. Similarly, column 5, could have the protrusion 28, and the top surface of column 6, could have the flat surface 29, for the placement or the formation of the identifying code. The protrusion 28, could have a notched opening 26, but it could also be a solid piece. The bottom surface of both columns 5 and 6, should have a notched-opening 45, to allow for the stacking of the versatile product carrier 1, or for the aligning of the carrier 1. The columns 5 and 6 could be hollow on the inside as shown in FIGS. 1 and 2, by the number 47, or they could be one solid piece with only openings 7, a protrusion 28 having an opening 26, and a small notched-opening 45. If the end columns 5 and 6, are hollow then this would reduce the material and/or the overall weight of the product carrier and possibly reduce the fabrication costs. The end plates 3 and 4, could be provided with corner support piece 24, to strengthen the carrier structure and to provide additional stability to the carrier. The support piece 24, could be an integral part of the carrier or it could be secured in its corner place with means well known in the art, such as, using a glue for bonding or using mechanical means, such as, screws or welding. An identifying code 18, can be formed on the side-wall of the end plates 3 and/or 4, to assist with the processing of the product that maybe contained within the product carrier 1.

The cross-bars 21 and 22, sturdily hold the end plates 3 and 4 together. The cross-bars 21 and 22, are usually symmetrical and completely identical. Both cross-bars 21 and 22, have four retaining means or heads 23. The cross-bars 21 and 22, may have a depressed area 27. The depressed area 27 may be an open area or it may have one or more openings to allow for the cleaning of the contents of the carrier or for allowing for a fluid to flow more into and out of the carrier. In some situations it may be preferred to have the depressed area a solid piece to provide strength and stability to the carrier. If the cross-bars 21 and 22, are hollow or the depressed area 27, has ribs or openings, then this would reduce the overall weight of the product carrier and possibly reduce the fabrication costs.

FIG. 2, shows the versatile product carrier of FIG. 1, in completely assembled shape. The product 40, which is one of the semiconductor products that this versatile product carrier is used to transport is shown in phantom lines in FIG. 2.

FIGS. 3 and 4, show different possible shapes for the retaining means or the head. FIG. 3, shows the head 23, having an open area 39, and an enlarged open area or cavity 40. The head 23 has a flexible snap lock 37, which gets inserted into the opening 7, of either column 5 or column 6. The snap lock 37, has a mating surface or straight seat 33, to mate with and accommodate the wall edge within the opening 7, of the versatile product carrier 1. The latch 35 prevents the snap lock 37, from sliding out of the opening 7, while the compression stabilizer 31, inserts a force against the inner walls of the end columns 5 and 6, and holds head 23, in place, thereby providing stability to the product carrier. The compression stabilizer 31, remains under compression to provide rigidity to the structure. As a further precaution, a wedge or a pin or a key 44, could be inserted into the opening 39. The wedge 44, can be of any geometric shape and should be designed to provide maximum locking protection. The wedge 44, looks more like a baseball bat, having a protruding region 46, which is inserted into the enlarged opening or cavity 40. The main purpose for the insertion of the wedge 44, into the openings 39 and 40, is to prevent the snap locks 37, from accidentally getting compressed and being able to slide out of the opening 7. The depressed area 27, could also be provided with at least one opening 30. The opening 30, would allow the fluid to move into and out of the versatile product carrier. These openings can be of any size or shape and their overall exact dimensions would depend upon the structural integrity requirements of the versatile product carrier.

FIG. 4 shows a head 43, which is similar to the head 23, except the flexible snap lock 47, has a mating surface or straight seat 34, to mate with and accommodate the wall edge within the opening 7, of the versatile product carrier 1. Also the latch 45, is a little more pronounced than the latch 35, of the head 23. As shown in FIG. 4, the area 49, is an open area.

Figure 5:
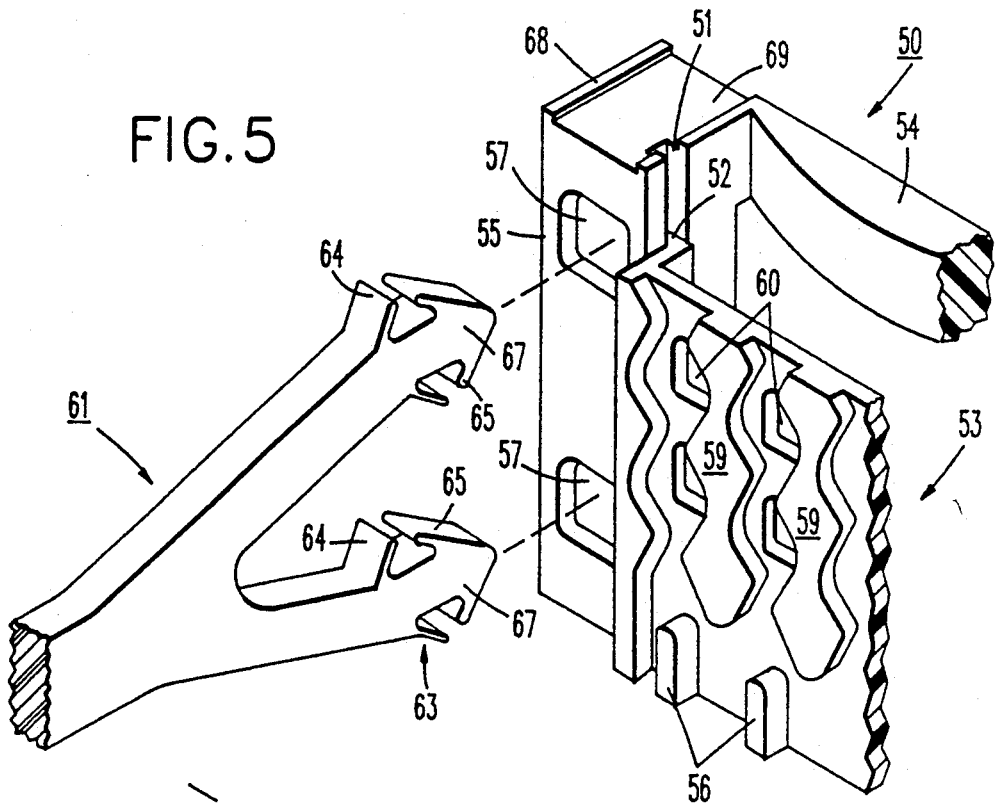
FIG. 5 is a cut-away perspective view of another embodiment of a versatile product carrier made according to this invention.

FIG. 5 is a partial view of another embodiment of the versatile product carrier. The end plate 50 has a column connecting bar 54, along with a centerpiece 53, and end column 55, having openings 57. The wave-like raised segments 59, hold the product in a vertical position, while the stop 56, prevents the product (not shown) from sliding down. The opening 60, allow for the fluid to pass through and to allow for the cleaning of the versatile product carrier and/or the product. The raised segments 59, could have at least one opening, similar to the openings 19, in the raised segments 9, to allow for the fluid to pass through and to allow for the cleaning of the versatile product carrier and/or the product. The modular centerpiece 53, has a mating slider 52, that goes into the track 51 and mates with the end column 55. The mating slider 52, can be bonded, welded, brazed or snapped in place or secured by other means to the track 51, to make the centerpiece 53, an integral part of the end plate 50. The spacing between the raised segments 59, could of course be different to accommodate different size products. The end column 55, is similar to end columns 5 and 6 already described earlier. The end column 55 has openings 57, to accommodate the head 23 or head 43 or head 63. The column connecting bar 54, can have notches (not shown) which are similar to the notched-openings 11, already discussed above. These notches 11, are usually used for robotic alignment. Similarly, the top surface of the end column 55, could be provided with a flat surface 69, and/or a lip or raised section 68, for the placement or formation of an identifying code, such as a decal or a UPC bar code or a BCD code or a protruding portion similar to protrusion 28, discussed earlier. The bottom surface of the end column 55, could be provided with openings similar to openings 45, to provide alignment and for stacking the versatile product carriers. The cross-bar 61, is shown as a solid piece, but it could be of some other shape. The cross-bar 61, partially shown, has a head 63. The head 63, has a flexible snap lock 67, having a latch 65. The head 63, also has a compression stabilizer 64. The cross-bar 61, as shown, is a solid piece without a depressed area, but it could have a depressed area. Similarly, the cross-bar 61 could also having ribs or openings, similar to the ones shown in FIGS. 3 and 4.

Figure 6:
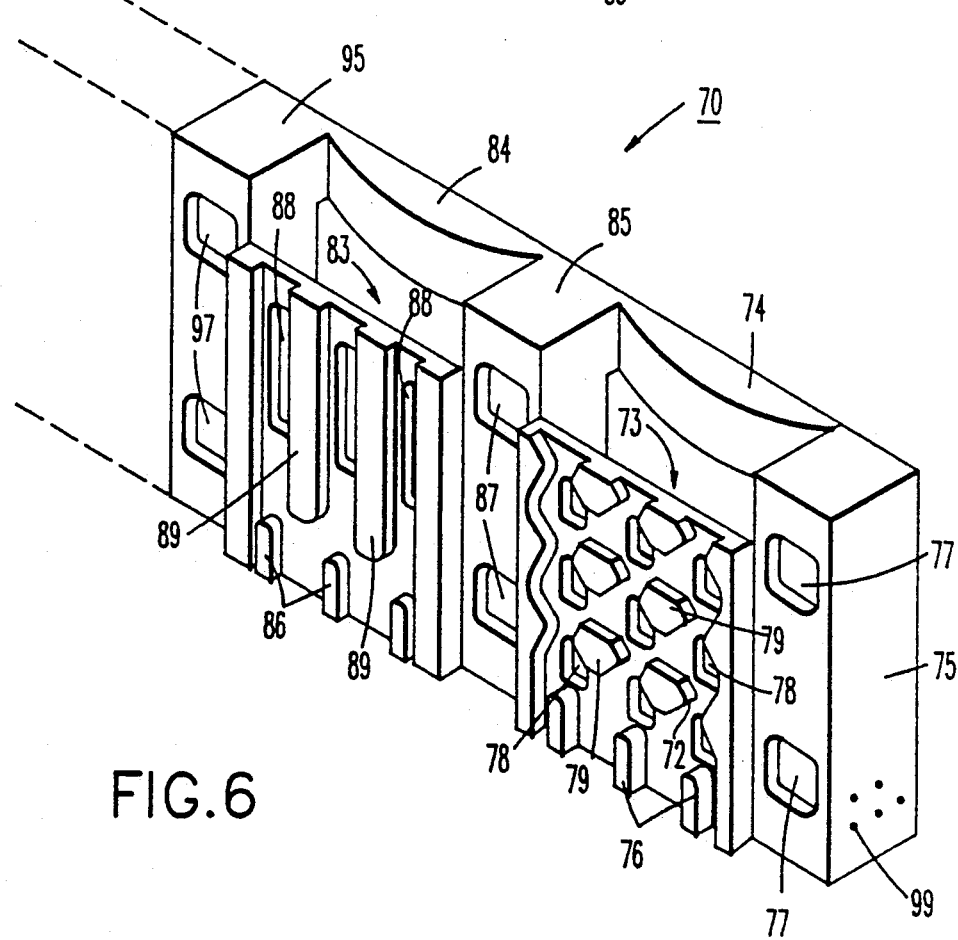
FIG. 6 is a cut-away perspective view of another embodiment of a versatile product carrier made according to this, invention showing only the end plate of the versatile product carrier.

FIG. 6 shows a partial embodiment of a versatile product carrier made according to this invention. Only one wall of the carrier is shown. The end plate 70, comprises a battery of end columns and centerpieces. As shown in FIG. 6, the end plate 70 has end columns 75, 85 and 95 having openings 77, 87 and 97, respectively. The centerpieces 73 and 83, are held between columns 75 and 85, and between 85 and 95, respectively. The column connecting bars 74 and 84, join the end columns 75 and 85, and end columns 85 and 95, respectively. The column connecting bars 74 and 84, could have notched-openings similar to the notched-openings 11, shown in FIG. 1. The centerpiece 73, has raised tablets 79, with openings 78. The raised tablets 79, securely hold the product (not shown) in an upright position, and the stops 76 and 86, prevent the product from sliding. The raised tablets 79, have contoured side walls that have a point contact 72. This point contact 72, makes a minimum contact with a product (not shown), and further helps to reduce particulate contamination normally produced by rubbing of the surfaces or by the adherence of the particulates to the surface within the track. The centerpiece 83, has raised columns or segments 89, with slotted openings 88. The openings 78 and 88, allow for the fluid to pass through and to allow for the cleaning of the versatile product carrier and/or the product. The raised tablets 79, and the raised segments 89, could have at least one opening, similar to the openings 19, in the raised segments 9, to allow for the fluid to pass through and to allow for the cleaning of the versatile product carrier and/or the product. An identifying code 99, could also be placed on the side of a column as shown in conjunction with end column 75. A mirror image of the end plate 70, would be required to securely form a versatile product carrier using any of the cross-bars disclosed in this specification. The openings 77, 87, and 97 accommodate a cross-bar to securely form the versatile product carrier.

FIG. 7 is another embodiment of the linking means or the cross-bar that can be used with the versatile product carrier of this invention. Also shown is a cut-away of an end column that would accommodate this type of a cross-bar. The centerpiece (not shown) could also have the same or similar shape as shown for the end column 109. The H-shaped cross-bar 101, has heads 103. The heads 103 are similar to the heads already described earlier. The cross-bar 101, has an upper arm 106, and a lower arm 108. The upper arm 106, and the lower arm 108, maybe of the same length or of a different length. The head 103, has a compression stabilizer 104, a lead-in latch 105, and a flexible snap-lock 102. As shown in FIG. 7, the length of the upper arm 106, is different than the length of the lower arm 108, and therefore the end column of the versatile product carrier has to be shaped to allow the head 103, to snap or bond into the opening of the end column. One such embodiment is shown in FIG. 7, where the end column 109, having opening 107, to accommodate the head 103, is shaped to conform to the upper arm 106, and the lower arm 108, of the H-shaped cross-bar 101.

FIG. 8 shows yet another embodiment of the linking means or the cross-bar to be used with the versatile product carrier of this invention. The cross-bar 111, has struts 112, to further secure the cross-bar 111 from twisting or turning. Head 113, which is similar to the head 23, is shown with the cross-bar 111, but any head disclosed can be used. On the side of the cross-bar 111, an identifying code 119, could also be placed.

FIG. 9 shows yet another embodiment of the linking means or the cross-bar and having a variety of retaining means to be used with the versatile product carrier of this invention. The cross-bar 121, has struts 122, to further secure the cross-bar 121 from twisting or turning. The cross-bar as shown has four different types of retaining means or heads, namely, heads 123, 126, 133 and 136. For most applications only one type of a head would be used. Head 123 is shown with the compression stabilizer 124, and a post 125. In some situations a compression stabilizer may not be needed for the head of a cross-bar as shown by head 133, and head 136. The head 133, comprises of a post 135. The cross-section of the post 125 or the post 135, can be of any shape, such as, it could be a square or a round or a rectangular or any other shape known to a person skilled in the art. The head 126, as shown has a compression stabilizer 124, and a plurality of fingers 127, with openings 129. The head 136, has fingers 137, with openings 139. The openings 129, or the openings 139, could be large enough to accommodate a conformal wedge or a key, as discussed earlier. The retaining means or the head as discussed earlier can of course be welded, bonded, glued, brazed or snapped into the opening in the end columns. Other head shapes disclosed can also be used.

FIG. 10, shows another embodiment of wedge or key that can be used to further secure the head of a cross-bar from slipping or sliding out of the opening in the end column. The conformal flat pin or key or wedge 144, is rectangular in shape and has protrusion 146. The wedge 144 is inserted sideways into the mouth or opening of a head, such as head 23 or 43, and then twisted or turned 90 degrees so that the protrusion 146, fully occupies the opening, such as opening 40 in head 23 or 43.

Figure 11:
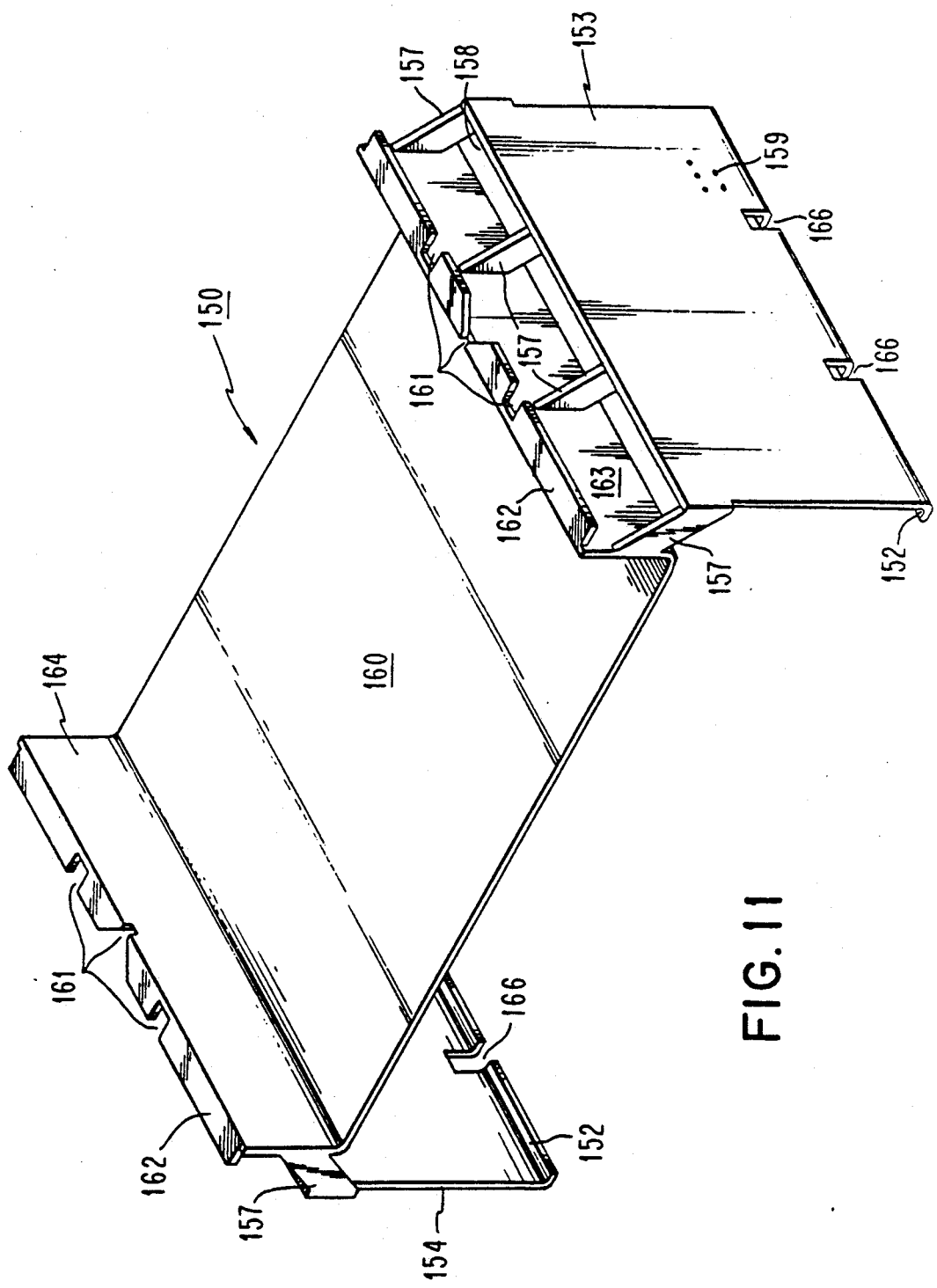
FIG. 11 is a perspective view of a cover for a product carrier made according to the present invention.

A cover 150, that can be used with the versatile product carrier of this invention is shown in FIG. 11. The cover 150, is usually made of molded or extruded plastic, but other methods or materials could be used, such as extrusion or machining or using materials such as composites or metals. The cover 150, has a first side-wall 153, and a second side-wall 154, and top side-walls 163 and 164, respectively. A canopy 160, links the top side-wall 163, with the top side-wall 164. Both side-walls 163 and 164, have a ledge or lip 162, with alignment notch or notched-openings 161. The notched-openings 161, act as a guide or an aligning means for the robotic arm. Linking means or ribs or struts 157, link the top side-walls 163 and 164, to the first side-wall 153, and the second side-wall 154, respectively. Between the struts 157, there could be an open area 158. Additionally, the first side-wall and the top side-wall and the second side-wall and the top side-wall can be one piece, without the struts and without any opening where the two pieces meet. The first side-wall and the second side-wall have openings 166, to allow the fluid to move into and out of the versatile product carrier. These openings 166, could be similar to the alignment notch 161, for the alignment of a robotic arm, or for use during an automated process. Similarly, the processing of the product could be expedited or closely monitored by having an identifying code 159, formed on an appropriate surface of the cover 150. Both the first side-wall 153 and the second side-wall have lip or ledge 152, that snaps into the lip or ledge 12, of the versatile product carrier, to cover and to lift the carrier of this invention. The side-walls 153 and 54, and the canopy 160, are shown as one solid piece, but they could have openings or be perforated to allow for the fluids to enter and egress from the versatile product carrier. The cover 150, could also be made of a transparent material to allow an operator to see the contents covered by the cover 150. A translucent type material could also be used for the cover 150. In a robotic or an automatic process, a robotic arm (not shown) would grasp the cover 150, from the two ledges or lips 162, and press inwardly thereby forcing the lip or ledge 152, to move outwardly and away from the lip or ledge 12. This robotic arm action would separate the cover 150, from the versatile product carrier and thus the cover 150, would be easily removed. Using the reverse process the cover 150, could be easily mounted onto a versatile product carrier of this invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A versatile product carrier comprising:
   (a) a first end plate having a plurality of columns linked by a first centerpiece, said first centerpiece having means for accommodating a product,
   (b) two or more linking means having an end, and further having a snapable retaining means at each said end,
   (c) a second end plate having a plurality of columns linked by a second centerpiece, said second centerpiece having means for accommodating a product,
   (d) each of said columns having at least one opening, to accommodate said snapable retaining means of said linking means,
   (e) said first end plate and said second end plate are linked together by said snapable retaining means by inserting said snapable retaining means of said linking means into said openings in said columns.

2. The versatile product carrier of claim 1, wherein at least one of said centerpiece has at least one opening.

3. The versatile product carrier of claim 1, wherein said centerpieces have at least one stop to vertically support said product.

4. The versatile product carrier of claim 1, wherein said centerpieces have at least one raised segment to vertically support said product.

5. The versatile product carrier of claim 1, wherein said versatile product carrier is made from molded plastic.

6. The versatile product carrier of claim 1, wherein said versatile product carrier is made from extruded plastic.

7. The versatile product carrier of claim 1, wherein said versatile product carrier is made from metal.

8. The versatile product carrier of claim 1, wherein said versatile product carrier is made by machining.

9. The versatile product carrier of claim 1, wherein said versatile product carrier is made from a composite material.

10. The versatile product carrier of claim 1, having at least one flat surface for placement or formation of an identifying code.

11. The versatile product carrier of claim 1, wherein at least one of said linking means has at least one rib.

12. The versatile product carrier of claim 1, wherein at least one of said linking means has at least one opening.

13. The versatile product carrier of claim 1, wherein at least one of said linking means has an upper arm and a lower arm.

14. The versatile product carrier of claim 13, wherein said upper arm is of a different length than said lower arm.

15. The versatile product carrier of claim 1, wherein at least one of said snapable retaining means is bonded into said opening in said columns.

16. The versatile product carrier of claim 1, wherein at least one of said snapable retaining means is welded into said opening in said column.

17. The versatile product carrier of claim 1, wherein at least one of said snapable retaining means is brazed into said opening in said column.

18. The versatile product carrier of claim 1, wherein a portion of at least one of said column is hollow.

19. The versatile product carrier of claim 1, wherein at least a portion of said versatile product carrier is coated with an overcoating.

20. The versatile product carrier of claim 19, wherein said overcoating is an antistatic coating.

21. The versatile product carrier of claim 1, wherein at least one said centerpiece is coated with an overcoating.

22. The versatile product carrier of claim 1, wherein at least one column has a track to mate with a corresponding centerpiece.

23. A cover for a versatile product carrier of claim 1, comprising:
   (a) a first side-wall and a second side-wall, and
   (b) a canopy linking said first side-wall with said second side-wall.

24. The cover for a versatile product carrier of claim 23, wherein said first side-wall further comprises a top side-wall.

25. The cover for a versatile product carrier of claim 23, wherein said second side-wall further comprises a top side-wall.

26. The cover for a versatile product carrier of claim 23, wherein at least one side-wall further comprises a ledge.

27. The cover for a versatile product carrier of claim 23, having at least one flat surface for the placement or formation of an identifying code.

28. The cover for a versatile product carrier of claim 23, wherein at least one side-wall has at least one opening.

29. The cover for a versatile product carrier of claim 24, wherein at least one means for connecting is provided to connect said first side-wall to said top side-wall.

30. The cover for a versatile product carrier of claim 25, wherein at least one means for connecting is provided to connect said second side-wall to said top side-wall.

31. The cover for a versatile product carrier of claim 23, wherein said canopy has at least one opening.

32. The cover for a versatile product carrier of claim 23, wherein said cover is made of a transparent material.

33. The cover for a versatile product carrier of claim 23, wherein said cover is made of a translucent material.

34. The cover for a versatile product carrier of claim 23, wherein said cover is made from plastic.

35. The cover for a versatile product carrier of claim 23, wherein said cover is made from molded plastic.

36. The cover for a versatile product carrier of claim 23, wherein said cover is made from extruded plastic.

37. The cover for a versatile product carrier of claim 23, wherein said cover ia made from metal.

38. The cover for a versatile product carrier of claim 23, wherein said cover is made from a composite material.

* * * * *